United States Patent [19]

Karlin

[11] 4,092,584
[45] May 30, 1978

[54] DWELL MEASURING APPARATUS
[75] Inventor: Richard A. Karlin, Chicago, Ill.
[73] Assignee: Sun Electric Corporation, Chicago, Ill.
[21] Appl. No.: 789,408
[22] Filed: Apr. 21, 1977
[51] Int. Cl.² .......................................... G01R 13/42
[52] U.S. Cl. ............................................... 324/16 R
[58] Field of Search .................. 324/16 R, 15, 28 CB
[56] References Cited
U.S. PATENT DOCUMENTS

| 2,056,416 | 10/1936 | Allen | 324/15 X |
| 3,543,143 | 11/1970 | Wanninger | 324/16 R |
| 3,693,073 | 9/1972 | Colette | 324/16 R |

Primary Examiner—Stanley T. Krawczewicz

Attorney, Agent, or Firm—Allegretti, Newitt, Witcoff & McAndrews

[57] ABSTRACT

The disclosure describes an improved apparatus for measuring the dwell of an engine ignition system employing points which close to conduct current through a coil and which open to generate an ignition signal. The apparatus enables the pointer of a meter to move upscale for increasing dwell, thereby simplifying the reading of the meter. A shaping circuit shapes the ignition signal to form a charging pulse which stores energy in a charging capacitor. When the points are closed, the energy stored in the capacitor is transmitted through the meter by a switching circuit so that the pointer advances away from its zero position as the dwell of the ignition system increases.

6 Claims, 3 Drawing Figures

DWELL MEASURING APPARATUS

BACKGROUND AND SUMMARY OF THE INVENTION

This invention relates to measuring apparatus for engine ignition systems and more particularly relates to apparatus for measuring the dwell of such an ignition system.

Conventional ignition testers generally employ a single meter movement to measure engine revolutions per minute (RPM), dwell and voltage drop across the ignition points. RPM and voltage drop are generally represented on a scale which has a minimum (e.g., zero) RPM and voltage drop position on the left. As the amount of RPM or voltage drop increases, the pointer of the meter moves to the right.

When such a meter is used to measure dwell, the dwell indication is reversed. That is, the maximum (e.g., 360°) dwell position is on the left and decreasing amounts of dwell cause the pointer to move to the right.

The foregoing operation of conventional dwell-RPM-volt meters creates confusion because the RPM and voltage scales read to the right, whereas the dwell scale reads to the left. Although this problem has plagued the industry for years, no one has been able to devise an accurate and economical meter suitable for use on a variety of ignition systems in which the RPM and dwell scales both read in the same direction.

One attempt to devise such a meter is described in U.S. Pat. No. 3,543,143 (Wanninger — Nov. 24, 1970). In the Wanninger device a diode is connected in parallel with a meter and a storage capacitor is connected in series with the meter. Although the meter purports to read upscale for increasing dwell, it has a number of disadvantages. Firstly, the forward voltage drop across the diode causes current to flow through the meter while the ignition points are open. This mode of operation is the converse of the desired operation and decreases the accuracy with which relatively high degrees of dwell can be measured. Secondly, the ignition points are in the discharge path of the capacitor. As a result, the accuracy of the dwell indication depends on the voltage across the ignition points during the dwell period. Some ignition systems employing electronic points or switches have a voltage on the order of three volts during the dwell period, whereas ignition systems employing mechanical points have a voltage close to zero during the dwell period. If a Wanninger-type device is used on ignition systems employing electronic and mechanical points, a different dwell indication results even though the actual dwell periods are identical.

Accordingly, it is one object of the present invention to provide a dwell and RPM meter in which both scales read accurately in the same direction when used on different types of ignition systems.

Still another object is to provide a dwell meter in which the pointer is located in a zero position in the absence of current flow through the meter and advances away from the zero position as the dwell of the ignition system increases, and which can accurately indicate dwell on a variety of ignition systems.

Still another object of the invention is to provide a dwell meter of the foregoing type in which the energy produced by an ignition signal during a points open condition is stored and prevented from flowing through the meter by a switch connected in series with the meter. During the points closed or dwell condition, the switch enables at least part of the stored energy to flow through the meter without flowing through the points.

The foregoing objects are achieved by a radical departure from the device shown in the Wanninger patent. Contrary to Wanninger, the present invention does not employ an ammeter connected in parallel with a Zener diode or a diode connected across the ammeter. In general, the principal object of the invention is achieved by providing apparatus including a storage device for storing at least part of the energy in an ignition charging pulse and switching means connected in series with the meter means. The switching means transmits a portion of the stored energy through the meter during the dwell period and inhibits the transmission of energy through the meter while the ignition points are open.

DESCRIPTION OF THE DRAWINGS

These and other objects and advantages of the invention will hereafter appear in connection with the accompanying drawing wherein.

DESCRIPTION OF THE PREFERRED EMBODIMENTS

Figure 1:
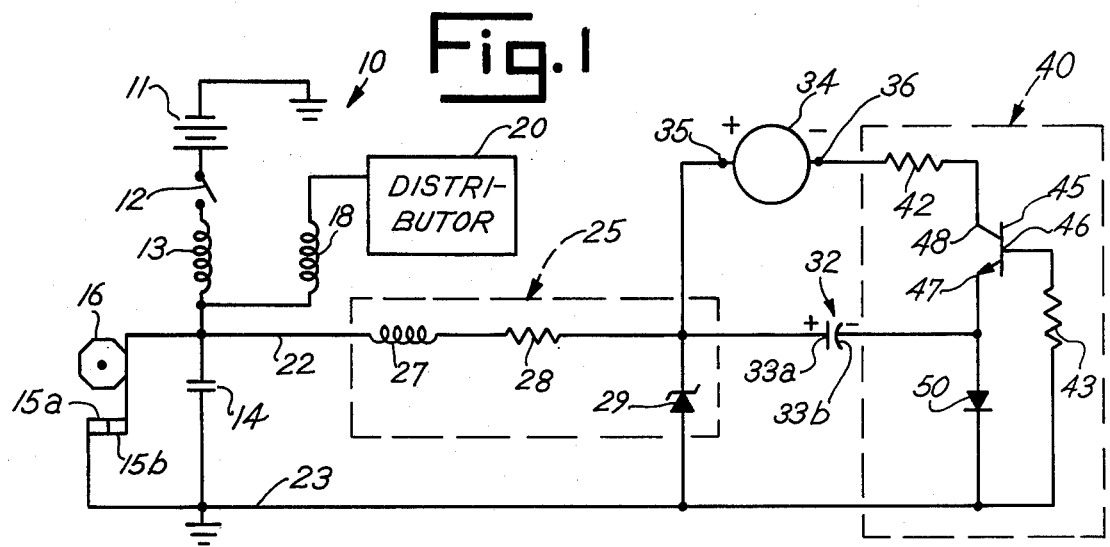
FIG. 1 is an electrical schematic drawing of a preferred embodiment of the present invention shown in connection with an exemplary ignition system.

Referring to FIG. 1, the preferred embodiment may be used in connection with a conventional internal combustion engine ignition system 10, including a 12-volt battery 11. The ignition system also includes a conventional ignition switch 12 which provides current to a primary coil 13. Ignition signals are generated in coil 13 by means of a conventional condenser 14 and a set of mechanical breaker points 15a, 15b which are opened and closed in synchronism with the engine by a cam 16. Points 15a, 15b form an ignition switch. The ignition signals generated by primary coil 13 induce a large voltage in a secondary coil 18 which is transmitted to a conventional distributor 20. Distributor 20 transmits the high energy secondary ignition signals to spark plugs in a well-known manner. Of course, the ignition system also could comprise a more modern system in which semiconductor electronic components perform the switching function accomplished by points 15a, 15b.

Figure 3:
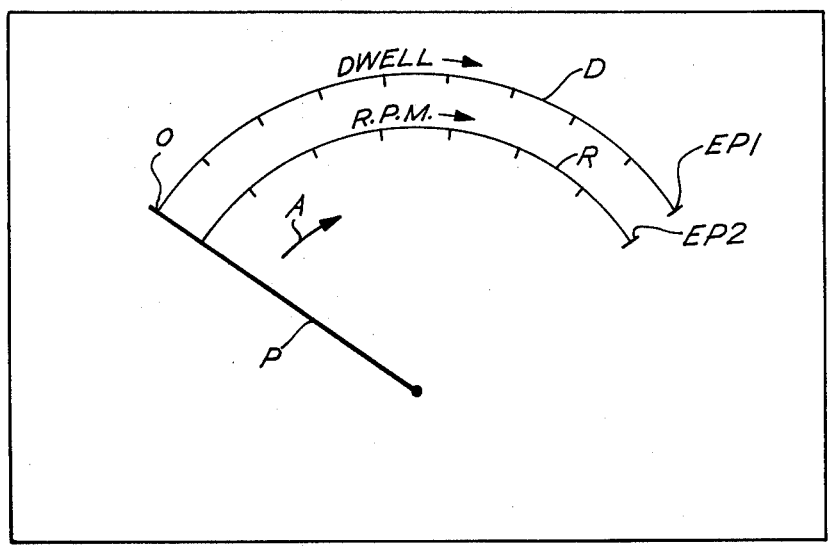
FIG. 3 is a plan view of a face of a meter used in connection with the present invention.

The preferred embodiment is connected to the ignition system by leads 22, 23 in the manner shown. The ignition signals are shaped by means of a shaping circuit 25 comprising an inductor 27, a resistor 28 and an 8-volt Zener diode 29. The ignition signals are shaped into a charging pulse by the operation of circuit 25 in a well-known manner. A storage capacitor 32 having plates 33a, 33b is associated with a meter 34 having a positive terminal 35 and a negative terminal 36. As shown in FIG. 3, when no current is flowing through meter 34, the pointer P of the meter is in the zero position shown. As the dwell of the ignition system increases, and as the RPM of the engine increases, the pointer moves in the direction of arrow A to the right in a manner described hereafter.

Referring again to FIG. 1, the preferred embodiment also includes a switching circuit including resistors 42, 43 and an NPN transistor 45 having a base 46, an emitter 47 and a collector 48. The switching circuit also includes a conventional switching diode 50 connected as shown.

In operation, ignition signals are generated by primary coil 13 when points 15a, 15b open. The ignition signal is shaped to a rectangular wave charging pulse by the shaping circuit in a well-known manner. While the points remain open, capacitor 32 is charged to the Zener voltage (e.g., 8 volts). However, while the points are open, no current flows through meter 34, because transistor 45 is biased in its non-conductive state. Transistor 45 is biased off because its emitter 47 is at a higher voltage than its base 46 by approximately the amount of the forward drop across diode 50.

As soon as points 15a, 15b close, emitter 47 is subject to a negative transient voltage. At that time, the base-emitter junction of transistor 45 is forward biased, thereby switching the collector-emitter junction to its conductive state. As a result, a portion of the charge stored in capacitor 32 flows from plate 33a through meter 34, resistor 42 and the collector-emitter junction of transistor 45 to plate 33b. In other words, capacitor 32, meter 34, resistor 42 and the collector-emitter junction of transistor 45 form a series circuit for driving meter 34 which does not include points 15a, 15b. This is an important feature which increases the accuracy of dwell measurements when the meter is used to measure different types of ignition systems. When the points open again, transistor 45 is biased to its non-conductive state, and the next cycle of operation begins.

Since the charge stored in capacitor 32 is conducted through meter 34 while the points are closed, pointer P swings to the right (in the direction of arrow A) as the dwell of the engine increases. This is an important feature because it enables a conventional tachometer or RPM circuit to be used in connection with the dwell circuit so that both the dwell and RPM scales (D and R, respectively) read in the same direction for increasing dwell and RPM.

Figure 2:
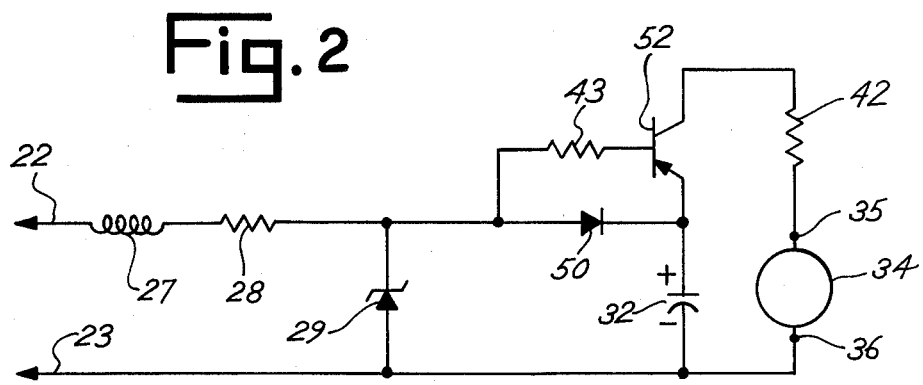
FIG. 2 is an electrical schematic drawing of an alternative embodiment of the present invention.

Referring to FIG. 2, an alternative embodiment of the present invention employing a PNP transistor is illustrated. The components as shown in FIG. 2 are identical to the like-numbered components shown in FIG. 1. However, a PNP transistor 52 is substituted for NPN transistor 45, and is connected in the manner shown. Those skilled in the art will recognize that the circuit shown in FIG. 2 operates substantially in the same way as the circuit shown in FIG. 1 to achieve the same result.

Those skilled in the art will recognize that the two embodiments described in detail herein may be modified and altered without departing from the true spirit and scope of the invention as defined in the accompanying claims.

What is claimed is:

1. Apparatus for measuring the dwell of an engine ignition system employing an ignition switch periodically opened and closed in synchronism with the engine, said ignition switch generating an ignition signal when the switch is open, said apparatus comprising:
   shaping means for shaping the ignition signal to form a charging pulse;
   storage means for storing at least part of the energy in the charging pulse;
   meter means including a pointer normally located in a zero position indicating minimum dwell in the absence of current flow through the meter means; and
   switching means connected in series with the meter means, said switching means being responsive to the closure of the ignition switch for transmitting at least a portion of the stored energy through the meter and responsive to the opening of the ignition switch for inhibiting the transmission of energy through the meter, whereby the pointer advances away from the zero position as the dwell of the ignition system increases.

2. Apparatus, as claimed in claim 1, wherein the shaping means comprises an inductor and a Zener diode.

3. Apparatus, as claimed in claim 1, wherein the storage means comprises a capacitor.

4. Apparatus, as claimed in claim 1, wherein the storage means, meter means and switching means form a series circuit.

5. Apparatus, as claimed in claim 3, wherein the switching means comprises:
   a switching device including a current conducting path having a first end and a second end and including a gate for switching the path into a conductive or non-conductive state;
   means for connecting the meter means to the first end of the conducting path;
   a diode operatively connected between the gate and the second end; and
   means for connecting the capacitor to the junction between the diode and the second end.

6. Apparatus, as claimed in claim 5, wherein the switching device comprises a transistor, the first end comprises a collector, the second end comprises an emitter and the gate comprises a base.

* * * * *